United States Patent
Yano

(10) Patent No.: US 9,029,176 B2
(45) Date of Patent: May 12, 2015

(54) SOLID-STATE IMAGING DEVICE AND METHOD FOR MANUFACTURING THE SAME

(75) Inventor: Hisashi Yano, Toyama (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 315 days.

(21) Appl. No.: 13/448,457

(22) Filed: Apr. 17, 2012

(65) Prior Publication Data

US 2012/0267742 A1 Oct. 25, 2012

(30) Foreign Application Priority Data

Apr. 20, 2011 (JP) ................................. 2011-094004

(51) Int. Cl.
  *H01L 21/00* (2006.01)
  *H01L 27/146* (2006.01)
(52) U.S. Cl.
  CPC ..... *H01L 27/14629* (2013.01); *H01L 27/14627* (2013.01); *H01L 27/14685* (2013.01)
(58) Field of Classification Search
  CPC .............. H01L 27/14685; H01L 27/14629; H01L 27/14627
  USPC ............... 257/432, E31.127, E33.67; 438/31
  See application file for complete search history.

(56) References Cited

U.S. PATENT DOCUMENTS

| 2004/0000669 | A1 | 1/2004 | Yamamura |
| 2007/0075343 | A1 | 4/2007 | Yamamura |
| 2008/0135732 | A1 | 6/2008 | Toumiya et al. |
| 2009/0278967 | A1* | 11/2009 | Toumiya ........................ 348/294 |
| 2010/0007779 | A1* | 1/2010 | Nakata et al. .................... 438/73 |
| 2010/0025571 | A1 | 2/2010 | Toumiya et al. |
| 2010/0136738 | A1 | 6/2010 | Yamamura |
| 2012/0202312 | A1* | 8/2012 | Suzuki et al. .................... 438/73 |

FOREIGN PATENT DOCUMENTS

| JP | 2003-324189 | 11/2003 |
| JP | 2008-166677 | 7/2008 |
| JP | 2009-267062 | 11/2009 |
| JP | 2009-272568 | 11/2009 |
| JP | 2010-092988 | 4/2010 |

* cited by examiner

*Primary Examiner* — Yasser A Abdelaziez
*Assistant Examiner* — Hajar Kolahdouzan
(74) *Attorney, Agent, or Firm* — Panasonic Patent Center

(57) ABSTRACT

The present invention achieves an optical characteristic exhibiting excellent sensitivity or the like, by increasing the opening dimension of an optical waveguide without changing the interconnection layout, so that the optical waveguide can surely be filled with a film having high refractive index. Pixel portion A of a solid-state imaging device includes photodiode PD formed on a semiconductor substrate; a first insulating film including a concave portion above photodiode PD; and a second insulating film formed on the first insulating film such that the concave portion is filled with the second insulating film. Peripheral circuit portion B of the solid-state imaging device includes an internal interconnection formed in the first insulating film and a pad electrode formed on the internal interconnection to be electrically connected to the internal interconnection. The pad electrode is formed on the second insulating film.

10 Claims, 10 Drawing Sheets

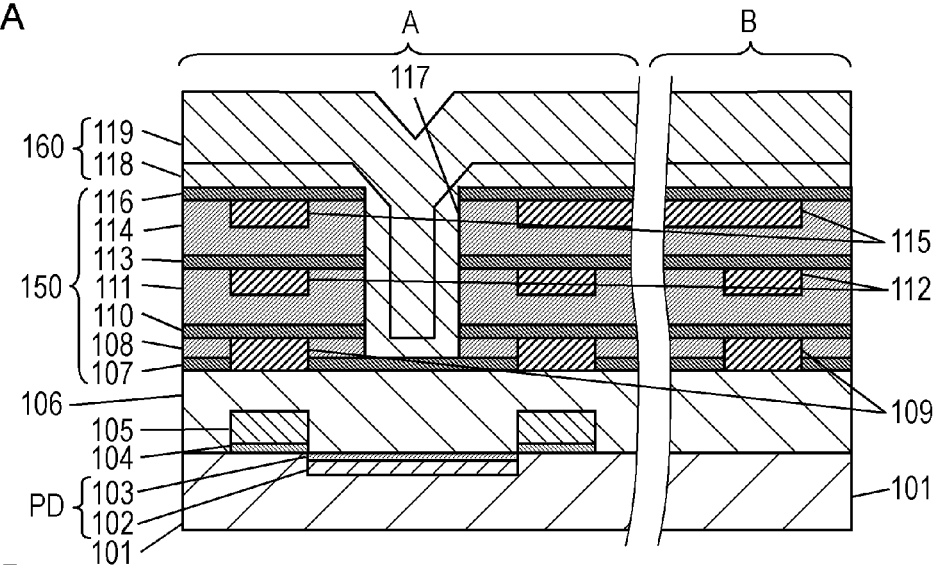
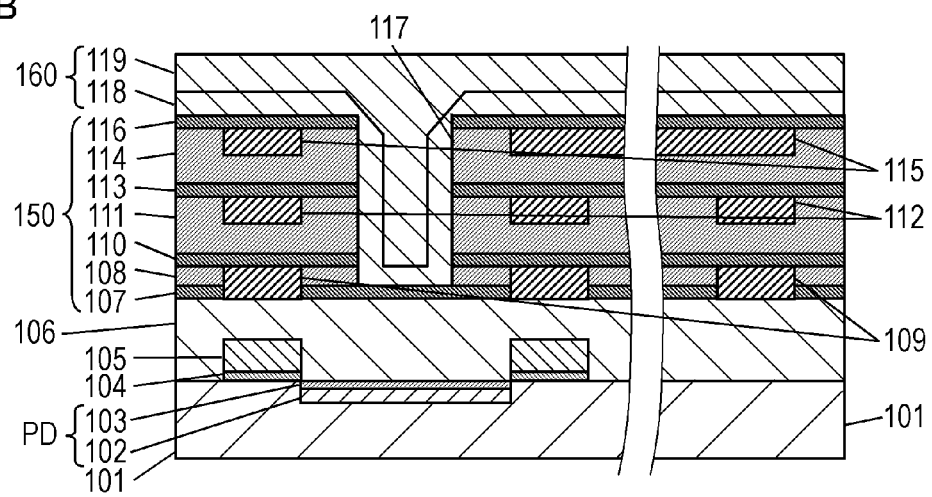
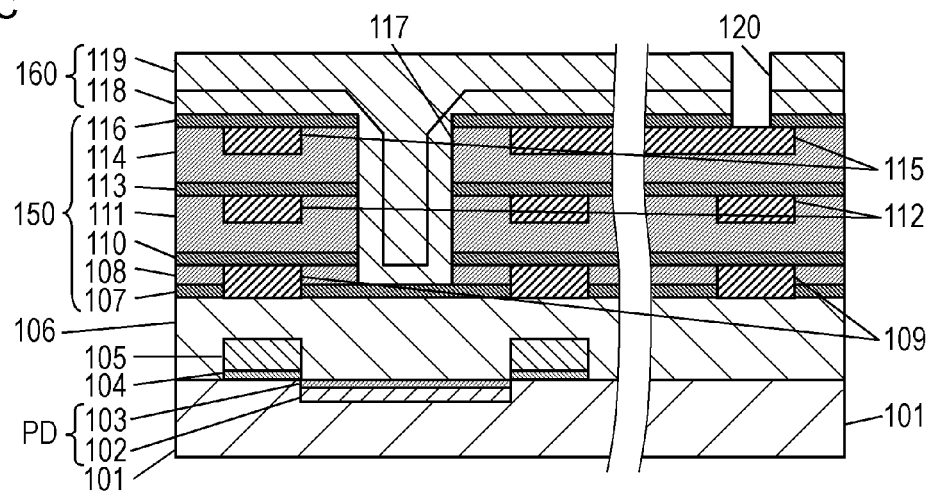

SOLID-STATE IMAGING DEVICE AND METHOD FOR MANUFACTURING THE SAME

BACKGROUND

1. Technical Field

The present invention relates to a solid-state imaging device including an optical waveguide and a method for manufacturing the same.

2. Background Art

In recent years, in connection with solid-state imaging devices, miniaturization of pixels has been promoted due to an increase in the number of pixels. In association therewith, miniaturization of a light receiving portion has been promoted, which causes difficulties to each light receiving portion in maintaining its high sensitive performance. Addressing this problem, what are proposed are solid-state imaging devices in which an optical waveguide is provided on a photodiode being a light receiving portion (for example, see Unexamined Japanese Patent Publication No. 2008-166677). Since the optical waveguide is structured with a material whose refractive index is high, the incident light can efficiently be propagated to the photodiode without being leaked to the outside of the optical waveguide.

FIG. 10 shows a cross-sectional structure of a semiconductor device according to a conventional example disclosed in Unexamined Japanese Patent Publication No. 2008-166677. As shown in FIG. 10, in pixel portion $R_{PX}$, an optical waveguide is formed in concave portion H above photodiode PD so as to penetrate through layered insulating films 21, 22, 25 and others. In the optical waveguide, a buried insulating film (passivation film 36) and a resin film (buried layer 37) containing metal oxide whose refractive index is high are formed. Unexamined Japanese Patent Publication No. 2008-166677 discloses that, the optical waveguide is formed by, in concave portion H whose opening dimension is 0.8 μm and aspect ratio is approximately 1 to 2 or more, forming passivation film 36 that is made of silicon nitride or the like, that has a refractive index of 2.0, and that has a thickness of approximately 0.5 μm. Further, the optical waveguide is formed by embedding buried layer 37 made of resin whose refractive index is high, such as siloxane-base resin (refractive index 1.7), polyimide or the like.

Here, it is disclosed that passivation film 36 is thickly deposited on the edge portion of concave portion H and becomes thinner near the bottom portion because of anisotropy when it is deposited.

In peripheral circuit portion $R_{PAD}$, passivation film 36 and buried layer 37 are formed on pad electrode 32 made of aluminum. That is, according to the manufacturing method of the conventional example, after an aluminum interconnection including pad electrode 32 is formed, concave portion H to be the optical waveguide is formed. Then, concave portion H is sequentially filled with passivation film 36 and buried layer 37 to form the optical waveguide.

Passivation film 36 is made of silicon nitride formed by the chemical vapor deposition (CVD) process, and as described above, the refractive index thereof is approximately 1.9 to 2.0. On the other hand, buried layer 37 is made of resin formed by the application process, and as described above, the refractive index thereof is approximately up to 1.7.

SUMMARY

However, the conventional solid-state imaging device has a problem in that, since the concave portion to be the optical waveguide is formed after the interconnection is formed in the peripheral circuit portion, the distance from the pad electrode and the interconnection to the imaging region in the pixel portion cannot be reduced, and hence the opening dimension of the concave portion cannot fully be increased.

Specifically, in a lithography step of forming the concave portion for the optical waveguide above the photodiode, in the pad formation region around the pixel portion, the pad electrode and the interconnection (the contact interconnection) connecting the pad electrode and an internal interconnection are already formed. When a resist film is applied on the region where the pad electrode and the contact interconnection are formed in the peripheral circuit portion in this manner, uneven resist application (thickness unevenness that appears streaky) due to height differences occurs on the top side of the pad electrode and the contact interconnection and the region nearby. Accordingly, due to the effect of the uneven resist application, the distance from the pixel portion to the interconnection region and the pad formation region becomes great.

Meanwhile, the reason why the pad electrode and the contact interconnection are formed prior to the concave portion for the optical waveguide is formed is because the aspect ratio of the concave portion is prone to become greater attributed to miniaturization, which necessitates use of a resin material possessing a high filling performance as the buried layer with which the concave portion is filled. Since the resin material in general cannot withstand the heat treatment that is performed when a protection film (passivation film) or the like formed on the pad electrode is formed, the following procedure must be employed. The pad electrode is firstly formed. Thereafter, the concave portion is formed, inside which the buried layer and the passivation film on the pad electrode are formed. Finally, the resin film is formed.

Further, a reduction in the alignment precision of the mask attributed to the uneven resist application, variations in the opening dimension and the like occur. In order to avoid interference with a lower-layer interconnection (internal interconnection) in a multi-layered interconnection layer under such a condition, the opening dimension of the concave portion cannot be increased. Further, the fact that it is difficult for the concave portion to be filled with a film having high refractive index such as silicon nitride also limits an increase in the light collecting performance of the light receiving portion.

According to the present invention, by securing a great opening dimension in the optical waveguide without changing the interconnection layout such that the optical waveguide can surely be filled with a film having high refractive index, an optical characteristic exhibiting excellent sensitivity and the like can be obtained.

According to the present invention, a solid-state imaging device has a structure in which an insulating film with which a concave portion to be an optical waveguide is filled is deposited, and thereafter a pad electrode and an interconnection provided in a peripheral circuit portion are formed.

Specifically, the solid-state imaging device according to the present invention is directed to a solid-state imaging device that is formed on a semiconductor substrate and that includes a pixel portion and a peripheral circuit portion. The pixel portion includes: a photodiode that is formed on the semiconductor substrate; a first insulating film that is formed on the semiconductor substrate and that includes a concave portion above the photodiode; a second insulating film that is formed on the first insulating film such that the concave portion is filled with the second insulating film. The peripheral circuit portion includes: an interconnection that is formed in one of the first insulating film and an interlayer insulating film being an identical-level layer as the first insulating film; and a pad portion that is formed on the interconnection and that is electrically connected to the interconnection. The pad portion is formed on one of the second insulating film and a third insulating film being an identical-level layer as the second insulating film.

With the solid-state imaging device according to the present invention, the pixel portion includes the second insulating film that is formed such that the concave portion above the photodiode formed on the semiconductor substrate is filled with the second insulating film. The peripheral circuit portion includes the pad portion that is formed on the interconnection and that is electrically connected to the interconnection, and the pad portion is formed on one of the second insulating film and the third insulating film being an identical-level layer as the second insulating film. That is, the pad portion is formed on the second insulating film with which the concave portion structuring the optical waveguide is filled or on the third insulating film being an identical-level layer as the second insulating film. Therefore, the pad portion is formed after one of the second insulating film and the third insulating film being an identical-level layer as the second insulating film is formed. Accordingly, when the concave portion is formed in the first insulating film, no thickness unevenness of the resist associated with the pad portion or the like occurs on the top face of the first insulating film. Therefore, even when the layout of the interconnection is identical to that of the conventional example, the opening dimension of the concave portion can be increased. As a result, since the film having high refractive index can be used as the second insulating film in place of a resin material, the optical characteristic exhibiting excellent sensitivity and the like can be obtained.

In the solid-state imaging device of the present invention, it is preferable that a height of the top face of the second insulating film in the pixel portion and one of a height of a top face of the second insulating film in the peripheral circuit portion and a height of a top face of the third insulating film being an identical-level layer as the second insulating film are identical to each other.

In the solid-state imaging device of the present invention, the second insulating film may be structured with a film made up of at least two layers.

In this case, a peripheral portion at a top end of the concave portion of at least a first one of the two layers of the second insulating film may be formed so as to widen upward.

In the solid-state imaging device of the present invention, it is preferable that the second insulating film has a refractive index being greater than 1.75.

In the solid-state imaging device of the present invention, it is preferable that the second insulating film includes one of silicon nitride and silicon oxynitride.

In the solid-state imaging device of the present invention, it is preferable that the third insulating film has a refractive index being smaller than 1.75.

In the solid-state imaging device of the present invention, the interconnection may include copper as its main component, and the pad portion may include aluminum as its main component.

Further, the method for manufacturing a solid-state imaging device of the present invention is directed to a method for manufacturing a solid-state imaging device that is formed on a semiconductor substrate and that has a pixel portion and a peripheral circuit portion. The method for manufacturing a solid-state imaging device includes: forming a photodiode in the pixel portion on the semiconductor substrate; and forming a first insulating film on the semiconductor substrate so as to cover the photodiode. The method further includes forming an interconnection in the first insulating film in the peripheral circuit portion; and selectively forming a concave portion to be an optical waveguide above the photodiode in the first insulating film. The method further includes forming a second insulating film on the first insulating film such that the concave portion is filled with the second insulating film; and forming a pad portion that is electrically connected to the interconnection on the second insulating film in the peripheral circuit portion.

According to the method for manufacturing a solid-state imaging device of the present invention, the interconnection is formed in the first insulating film in the peripheral circuit portion, and thereafter, the concave portion to be the optical waveguide is selectively formed above the photodiode in the first insulating film. Subsequently, the second insulating film is formed on the first insulating film such that the concave portion is filled with the second insulating film. Thereafter, the pad portion electrically connected to the interconnection is formed on the second insulating film in the peripheral circuit portion. In this manner, when the concave portion is selectively formed in the first insulating film, no thickness unevenness of resist associated with the pad portion or the like occurs on the top face of the first insulating film. Therefore, even when the layout of the interconnection is identical to that of the conventional example, the opening dimension of the concave portion can be increased. As a result, since the film having high refractive index can be used as the second insulating film in place of a resin material, the optical characteristic exhibiting excellent sensitivity and the like can be obtained.

The method for manufacturing a solid-state imaging device of the present invention further includes, after the forming the second insulating film, removing the second insulating film in the peripheral circuit portion; and forming a third insulating film in a region where the second insulating film is removed in the peripheral circuit portion, the third insulating film being smaller than the second insulating film in a refractive index of light. In the forming the pad portion, the pad portion may be formed on the third insulating film.

In the method for manufacturing a solid-state imaging device of the present invention, it is preferable that the third insulating film has a refractive index being smaller than 1.75.

In the method for manufacturing a solid-state imaging device of the present invention, the second insulating film may be structured with a film made up of at least two layers.

In the method for manufacturing a solid-state imaging device of the present invention, in the forming the second insulating film, a peripheral portion at a top end of the concave portion of at least a first one of the two layers of the second insulating film may be etched so as to widen upward.

In the method for manufacturing a solid-state imaging device of the present invention, it is preferable that the second insulating film has a refractive index greater than 1.75.

In the method for manufacturing a solid-state imaging device of the present invention, it is preferable that the second insulating film includes one of silicon nitride and silicon oxynitride.

In the method for manufacturing a solid-state imaging device of the present invention, the interconnection may include copper as its main component, and the pad portion may include aluminum as its main component.

With the solid-state imaging device and the method for manufacturing the same of the present invention, the opening dimension of the optical waveguide provided on the photodiode can largely be secured without changing the interconnection layout. Accordingly, the optical waveguide can surely be filled with the film having high refractive index without inviting occurrence of a hollow (void). Accordingly, the optical characteristic being excellent in sensitivity and the like can be obtained.

BRIEF DESCRIPTION OF DRAWINGS

FIG. 4A is a schematic cross-sectional view showing a step of the method for manufacturing the chief portion of the solid-state imaging device according to one embodiment of the present invention;

FIG. 4B is a schematic cross-sectional view showing a step of the method for manufacturing the chief portion of the solid-state imaging device according to one embodiment of the present invention;

FIG. 4C is a schematic cross-sectional view showing a step of the method for manufacturing the chief portion of the solid-state imaging device according to one embodiment of the present invention;

DETAILED DESCRIPTION OF THE PREFERRED EMBODIMENT

One Exemplary Embodiment

Figure 1:
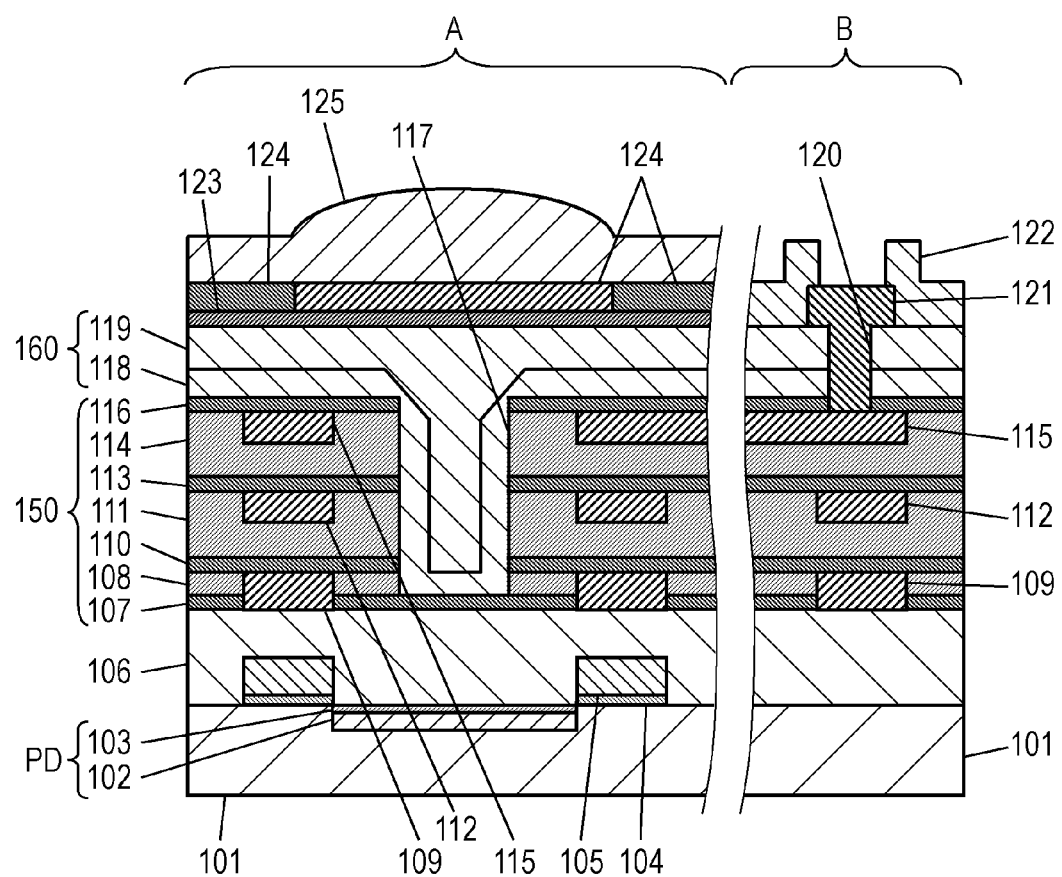
FIG. 1 is a schematic cross-sectional view showing a chief portion of a solid-state imaging device according to one embodiment of the present invention.

With reference to FIG. 1, a description will be given of a solid-state imaging device according to one embodiment of the present invention.

As shown in FIG. 1, the solid-state imaging device according to one embodiment is structured with pixel portion A and peripheral circuit portion B partitioned on semiconductor substrate 101 made of silicon (Si) or the like.

Pixel portion A includes photodiode PD made up of n type layer 102 formed on semiconductor substrate 101 and p type layer 103 formed on n type layer 102.

On semiconductor substrate 101, a plurality of transistors each having gate electrode 105 having gate insulating film 104 interposed are formed adjacent to photodiode PD. Each of the transistors functions to read the charges accumulated in photodiode PD. As gate insulating film 104, silicon oxide or the like can be used. As gate electrode 105, polysilicon or the like can be used.

On the entire surface of semiconductor substrate 101, bottom layer insulating film 106 made of silicon oxide ($SiO_2$) or the like and whose top face is planarized is formed, so as to cover the transistors and photodiode PD. On bottom layer insulating film 106, ground insulating film 107 made of silicon nitride (SiN), silicon carbonitride (SiCN) or the like is formed.

On ground insulating film 107, first interlayer insulating film 108, second interlayer insulating film 111 and third interlayer insulating film 114 each made of silicon oxide or the like are sequentially formed. In the region above gate electrode 105 in first interlayer insulating film 108, first internal interconnection 109 is formed. Similarly, in the region above first internal interconnection 109 in second interlayer insulating film 111, second internal interconnection 112 is formed. Similarly, in the region above second internal interconnection 112 in third interlayer insulating film 114, third internal interconnection 115 is formed. Here, as internal interconnections 109, 112 and 115, copper (Cu) or metal whose main component is copper can be used, for example.

Between first interlayer insulating film 108 and second interlayer insulating film 111, first liner film 110 covering the top face of first internal interconnection 109 is formed. Similarly, between second interlayer insulating film 111 and third interlayer insulating film 114, second liner film 113 covering the top face of second internal interconnection 112 is formed. Similarly, on third interlayer insulating film 114, third liner film 116 covering the top face of third internal interconnection 115 is formed. Here, liner films 110, 113 and 116 are each made of silicon nitride (SiN), silicon carbonitride (SiCN) or the like, and function as a diffusion prevention film of copper atoms structuring internal interconnections 109, 112 and 115.

Ground insulating film 107, first to third interlayer insulating films 108, 111 and 114, and first to third liner films 110, 113 and 116 stacked on bottom layer insulating film 106 are referred to first insulating film 150 for the sake of convenience.

In the region above photodiode PD in first insulating film 150, concave portion 117 to be an optical waveguide is formed. On first insulating film 150, second insulating film 160 made of silicon nitride (SiN), for example, is formed such that concave portion 117 is filled therewith. Here, second insulating film 160 is structured with first buried layer 118 whose thickness is 600 nm, for example, and second buried layer 119 formed on first buried layer 118. Further, the peripheral portion of first buried layer 118 at the top end of concave portion 117 is processed such that the wall face widens upward, i.e., subjected to so-called corner-cut etching.

In the region included in pixel portion A on second insulating film 160, planarization film 123, color filter 124 and lens 125 each made of organic resin, for example, are sequentially formed.

Figure 2:
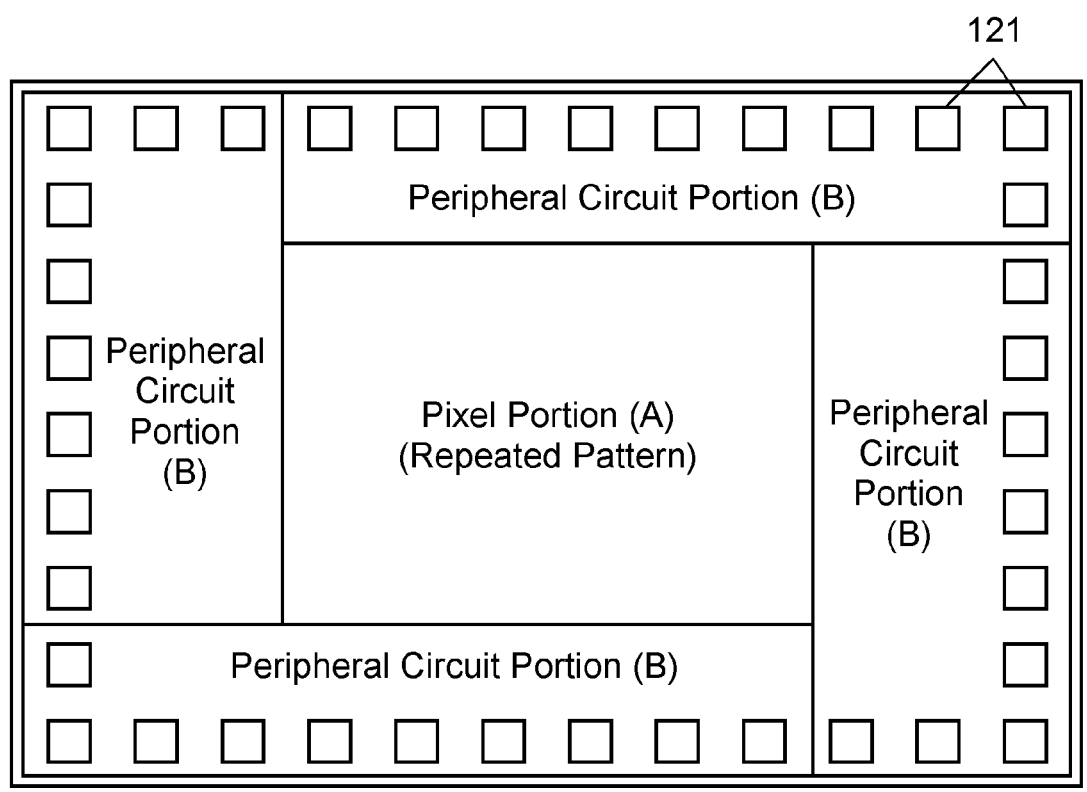
FIG. 2 is a schematic plan view showing the solid-state imaging device (semiconductor chip) according to one embodiment of the present invention.

As shown in FIG. 2, peripheral circuit portions B are formed to surround pixel portion A. Here, in pixel portion A, a plurality of pixels, one of which is shown in FIG. 1, are arranged in rows and columns.

Further, as shown in FIG. 1, in peripheral circuit portion B, bottom layer insulating film 106, ground insulating film 107, first insulating film 150, and second insulating film 160 sequentially formed on semiconductor substrate 101 are formed. In first insulating film 150, similarly to pixel portion A, first to third internal interconnections 109, 112 and 115, and first to third liner films 110, 113 and 116 are formed.

As shown in FIGS. 1 and 2, on second insulating film 160, pad electrode 121 being an external interconnection connected to third internal interconnection 115 via contact hole 120 is selectively formed. Pad electrode 121 establishes electrical connection with an external source. Here, as a material embedded in contact hole 120 and pad electrode 121, aluminum (Al) or metal whose main component is aluminum can be used. Further, on peripheral circuit portion B on second insulating film 160, protection film 122 made of silicon oxide is formed such that pad electrode 121 is exposed.

In the following, with reference to FIGS. 3A to 5B, a description will be given of a method for manufacturing the solid-state imaging device structured as described above.

Figure 3A:
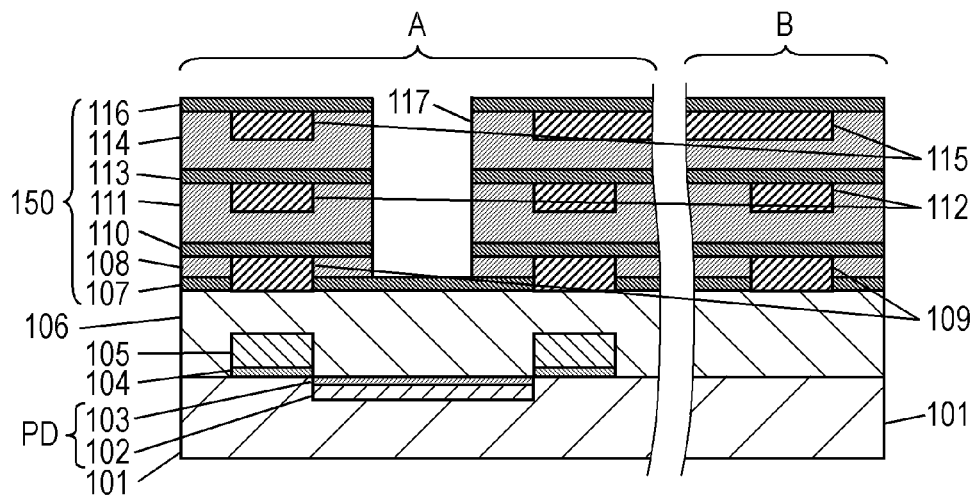
FIG. 3A is a schematic cross-sectional view showing a step of a method for manufacturing the chief portion of the solid-state imaging device according to one embodiment of the present invention.

First, as shown in FIG. 3A, photodiode PD made up of n type layer 102 and p type layer 103 is selectively formed by the ion injection process, on semiconductor substrate 101 in pixel portion A. Subsequently, on semiconductor substrate 101 and adjacent to photodiode PD, gate insulating film 104 and gate electrode 105 are selectively formed. Subsequently, on the entire semiconductor substrate 101, bottom layer insulating film 106 is deposited. Thereafter, the top face of deposited bottom layer insulating film 106 is planarized using the chemical mechanical polishing (CMP) process or the resist etch back process. Subsequently, on the entire bottom layer insulating film 106, ground insulating film 107 is deposited. Subsequently, first interlayer insulating film 108, first internal interconnection 109 and first liner film 110 are sequentially formed. Through this step, in pixel portion A and peripheral circuit portion B, the first layer of a multitude of (three layers of) interconnections is formed. It is to be noted that, first internal interconnection 109 can be formed by a so-called damascene process. Thereafter, the second and third layers, i.e., interlayer insulating films 111 and 114, internal interconnections 112, 115 and liner films 113 and 116 are formed similarly to the first layer.

Subsequently, by the lithography process and the etching process, concave portion 117 for forming an optical waveguide is selectively formed above photodiode PD in first insulating film 150, which is made up of insulating films ranging from ground insulating film 107 to third liner film 116. Here, for the dry etching, etching gas whose main component is fluorine (F) and carbon (C) can be used, such as $CF_4$, $C_3F_8$ or the like. It is to be noted that, while the bottom face of concave portion 117 matches with the top face of ground insulating film 107, the present invention is not limited thereto. That is, the bottom face of concave portion 117 may remain inside ground insulating film 107, and further, it may remain inside first interlayer insulating film 108. That is, the bottom face of concave portion 117 should be formed such that the length of concave portion 117 to be an optical waveguide (optical path length) is optimized.

Figure 3B:
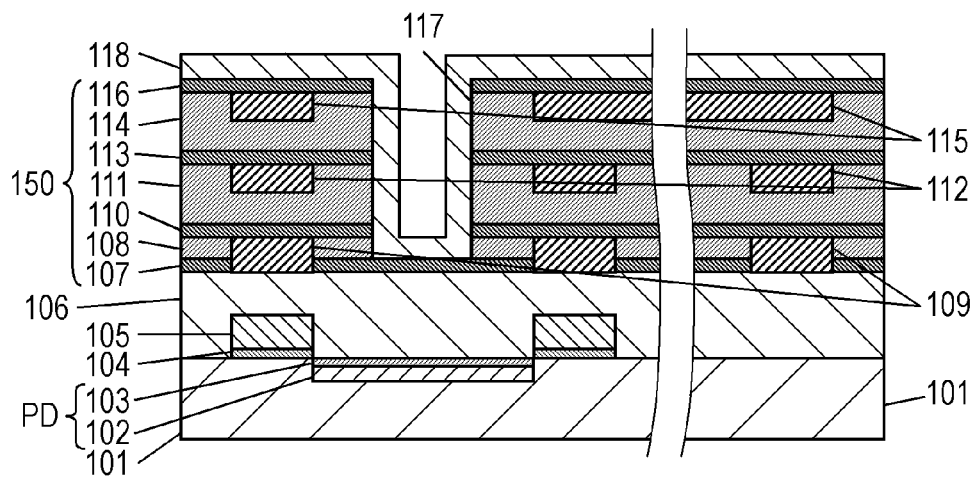
FIG. 3B is a schematic cross-sectional view showing a step of the method for manufacturing the chief portion of the solid-state imaging device according to one embodiment of the present invention.

Next, as shown in FIG. 3B, for example by the plasma CVD process, on third liner film 116, first buried layer 118 made of silicon nitride whose thickness is 600 nm is formed so as to cover the bottom face and the wall face of concave portion 117. The refractive index of silicon nitride formed herein is approximately 1.9 to 1.95.

Figure 3C:
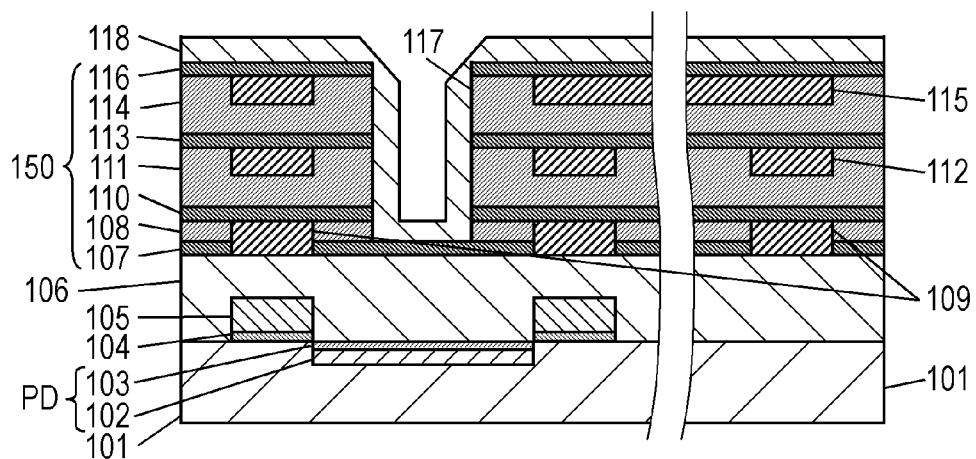
FIG. 3C is a schematic cross-sectional view showing a step of the method for manufacturing the chief portion of the solid-state imaging device according to one embodiment of the present invention.

Next, as shown in FIG. 3C, for example by the Ar sputter etching process, the corner-cut etching is performed to the top end portion of concave portion 117 in first buried layer 118, such that the peripheral portion thereof widens upward. This corner-cut etching is performed to improve the filling performance of the subsequently formed second buried layer 119 relative to concave portion 117. As described above, when the silicon nitride film is deposited by the plasma CVD process, the silicon nitride film is prone to be deposited thicker around the top end portion of the concave portion because of anisotropy when deposited. Accordingly, particularly when the opening dimension of concave portion 117 is small, the corner-cut etching is effective because the filling performance of second insulating film 160 is improved thereby. It is to be noted that, in performing the corner-cut etching, the chemical etching process in which $CF_4$, $CH_3F$ or the like is used as the etching gas may be used in place of the physical etching process of the Ar sputter etching process. The corner-cut etching by the chemical etching process in which $CF_4$, $CH_3F$ or the like is used as the etching gas provides not a linear but a rounded shape. That is, what should be obtained by the corner-cut etching is not necessarily a linear corner-cut shape, but may be a rounded shape. The etching process that can improve the widening shape of the top end portion of concave portion 117 in second buried layer 119 will suffice.

Next, as shown in FIG. 4A, again by the plasma CVD process, on first buried layer 118, second buried layer 119 made of silicon nitride whose thickness is 1000 nm is formed such that concave portion 117 is filled therewith. Silicon nitride structuring second buried layer 119 has the refractive index of 1.9 to 1.95, which is similar to that of first buried layer 118. Though second buried layer 119 leaves a slight recess on the top of concave portion 117, the inside of concave portion 117 can be filled with second buried layer 119 without inviting occurrence of a hollow (void).

It is to be noted that, in the present embodiment, the materials which are different in the etching selection ratio between interlayer insulating films 108, 111 and 114, and liner films 110, 113, and 116 are used. However, in the case where the materials with which the etching selection ratio becomes substantially identical between the interlayer insulating films and the liner films, or where no liner film is provided, the corner-cut etching may be performed to the entire first insulating film 150 itself. In this manner, second insulating film 160 can be deposited as a single buried layer, without being interrupted.

Further, in the present embodiment, the buried layers are formed by the plasma CVD process. However, when the opening diameter of concave portion 117 is great enough to be filled, what may be employed is the high density plasma CVD (HDP-CVD) process in which a film is formed while deposition and the Ar sputter etching are simultaneously performed. In this manner, second insulating film 160 can be formed as a single buried layer.

Next, as shown in FIG. 4B, by the CMP process, the top face of second buried layer 119 formed on the entire semiconductor substrate 101 is polished so as to be planarized, to eliminate the recess on the top portion.

Next, as shown in FIG. 4C, by the lithography process and the etching process, in peripheral circuit portion B, contact hole 120 that exposes third internal interconnection 115 is selective formed in second insulating film 160. In the present embodiment, as shown in FIG. 2, each pad electrode 121 is provided only in each peripheral circuit portion B arranged around pixel portion A. Therefore, contact hole 120 is also formed only in each peripheral circuit portion B.

Figure 5A:
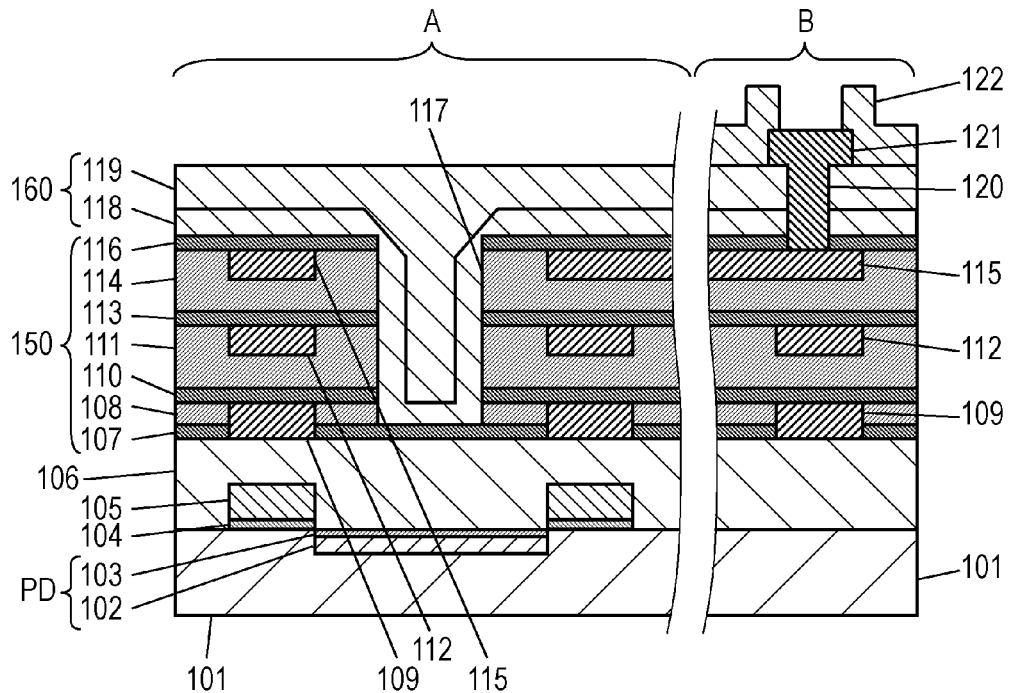
FIG. 5A is a schematic cross-sectional view showing a step of the method for manufacturing the chief portion of the solid-state imaging device according to one embodiment of the present invention.

Next, as shown in FIG. 5A, by the lithography process, the sputtering process and the like, pad electrode 121 made of aluminum whose thickness is, e.g., 700 nm, is selectively formed.

Subsequently, on the entire second insulating film 160, protection film 122 made of silicon oxide and whose thickness is 300 nm is formed. Thereafter, by the lithography process and the etching process, protection film 122 formed in pixel portion A is selectively removed. Further, by the lithography process and the etching process, the portion of protection film 122 formed above the pad electrode 121 in peripheral circuit portion B is selectively removed.

Figure 5B:
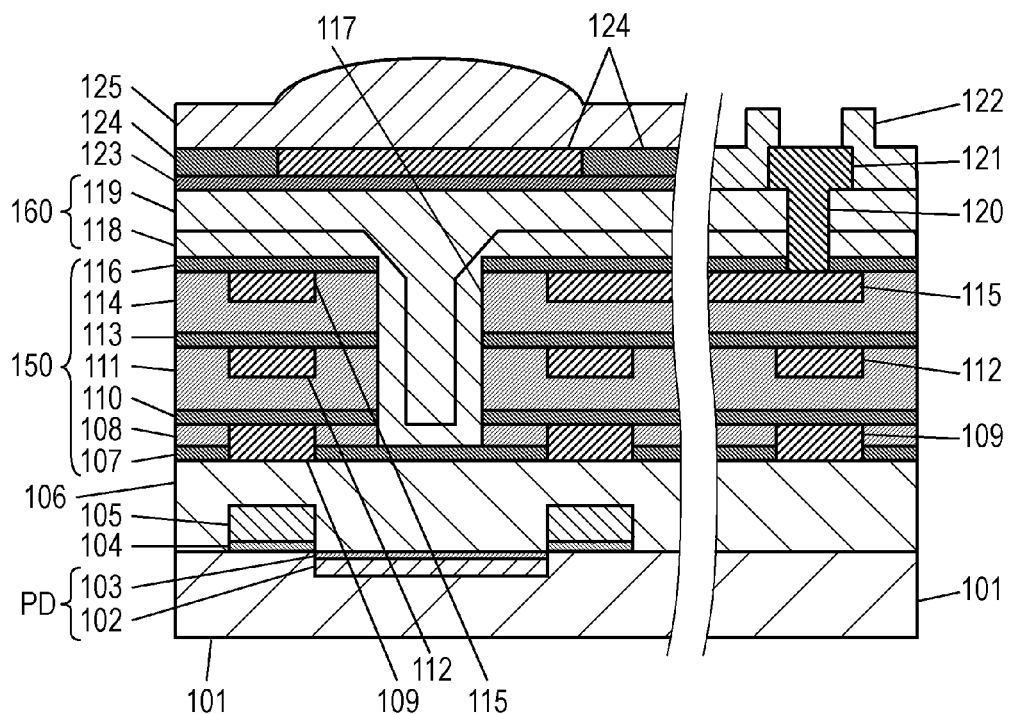
FIG. 5B is a schematic cross-sectional view showing a step of the method for manufacturing the chief portion of the solid-state imaging device according to one embodiment of the present invention.

Next, as shown in FIG. 5B, on second insulating film 160 exposed in pixel portion A, planarization film 123, filter 124 and lens 125 are sequentially formed.

In this manner, the solid-state imaging device shown in FIG. 1 can be obtained.

In the following, a description will be given of the reason why the opening diameter of concave portion 117 for forming the optical waveguide of the solid-state imaging device according to the present embodiment can be increased as compared to the referential example.

First, as shown in FIG. 3A, since the pad electrode is not formed yet in the lithography step of forming concave portion 117, no height difference exists in the peripheral region of pixel portion A. Accordingly, the lithography step can be performed to first insulating film 150 whose top face is extremely flat as the ground layer. Accordingly, since the resist film of an even thickness can be formed over the entire first insulating film 150, the alignment precision of the mask relative to the ground layer can be improved. As a result, concave portion 117 having an opening pattern of high dimension precision can be obtained.

For example, assuming a solid-state imaging device whose pixels each measure approximately 1.8 μm, [Table 1] shows the relationship between variations of the opening dimension of the concave portion and the required interval between the lower-layer interconnection and the concave portion.

TABLE 1

| ITEM | UNIT | EMBODIMENT OF PRESENT INVENTION | REFERENTIAL EXAMPLE |
|---|---|---|---|
| 1) (CONCAVE PORTION) OPENING DIMENSION VARIATIONS (3 σ) | nm | 20 | 80 |
| 2) INTERVAL BETWEEN LOWER LAYER INTERCONNECTION AND CONCAVE PORTION | nm | 10 | 10 |
| 3) TOTAL | nm | 30 | 90 |

As shown in item 1) in [Table 1], when the opening dimension of the concave portion is approximately 900 nm, in the present embodiment, the variations of the opening dimension is approximately 20 nm with 3σ (σ: standard deviation). This means the concave portion can be formed with the dimension precision of 900 nm±20 nm.

On the other hand, in connection with the referential example, the processing step of the concave portion is performed after the formation of pad electrode in peripheral circuit portion. The height of pad electrode is approximately 700 nm, and hence the height difference occurs by pad electrode. Therefore, as described above, an increase in variations of the thickness of the resist applied in the lithography step is invited, and the dimension variations of the concave portion become approximately 80 nm with 3σ.

Thus, in the referential example, the concave portion for forming the optical waveguide can only be formed with the dimension precision of 900 nm±80 nm. In contrast thereto, in the present embodiment, it can be formed with the dimension precision of 900 nm±20 nm.

Next, with reference to FIGS. 6A and 6B, a description will be given of the effect obtained by the improvement in the dimension precision of the concave portion shown in [Table 1].

Figure 6A:
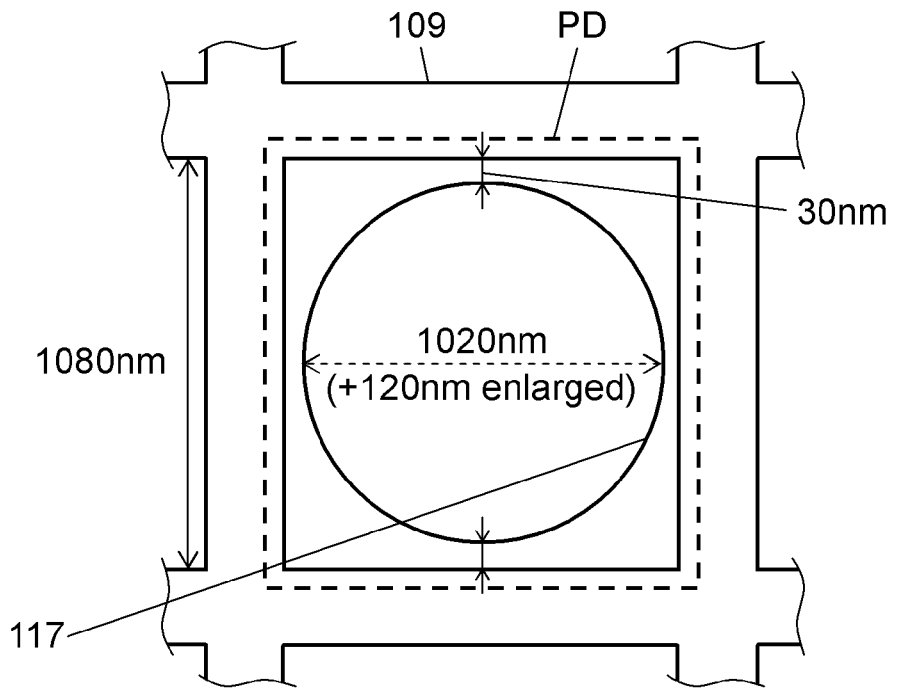
FIG. 6A is a schematic plan view showing a layout of one pixel of a pixel portion in the solid-state imaging device according to one embodiment of the present invention.
Figure 6B:
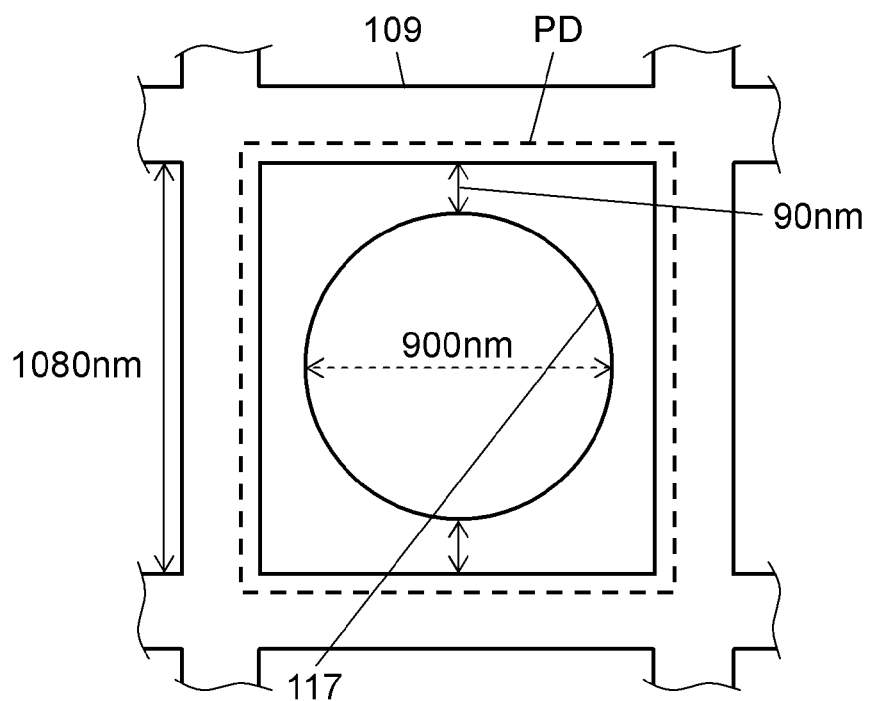
FIG. 6B is a schematic plan view showing a layout of one pixel of a pixel portion in a referential solid-state imaging device.

FIGS. 6A and 6B show the layout of the pixel portion. FIG. 6A shows the layout of the pixel portion according to the present embodiment, and FIG. 6B shows the layout of the referential pixel portion for comparison. In each layout, concave portion 117 to be the optical waveguide and photodiode PD are formed as being surrounded by internal interconnection 109.

In general, in the step of processing the concave portion, when the space in terms of layout between the internal interconnection and the concave portion is not enough, the concave portion will overlap with the internal interconnection when the concave portion is formed by etching. Accordingly, the layout must be designed such that the concave portion will not overlap with the internal interconnection, by securing a prescribed interval between them.

Further, as shown in item 2) in [Table 1], in order to secure the interval of at least 10 nm such that the lower-layer internal interconnection and the concave portion do not overlap with each other, as shown in the total column of item 3), the layout in the referential example must be designed such that an interval of 90 nm is secured between the internal interconnection and the concave portion.

In contrast thereto, in the present embodiment, it can be seen that the layout should be designed such that an interval of 30 nm is secured. That is, in FIG. 6B, assuming that the opening dimension of the concave portion according to the referential example is 900 nm, in the referential example, the required interval between internal interconnections in the pixel portion is 1080 nm. Here, in the present embodiment, when the layout is designed without changing the interval (1080 nm) between the internal interconnections 109, the interval between the internal interconnection 109 and the concave portion 117 can be made smaller. As a result, the opening dimension of concave portion 117 of 1020 nm can be achieved, and hence concave portion 117 can be formed as being greater than the referential example by 120 nm.

Further, in the referential example, it is necessary to provide a mitigation region for mitigating the thickness unevenness of the resist in the interconnection formation region or between the pad formation region and the imaging region. However, according to the present embodiment, such a mitigation region can be dispensed with. This provides an additional effect of a reduction in the chip area structuring the solid-state imaging device.

Figure 7A:
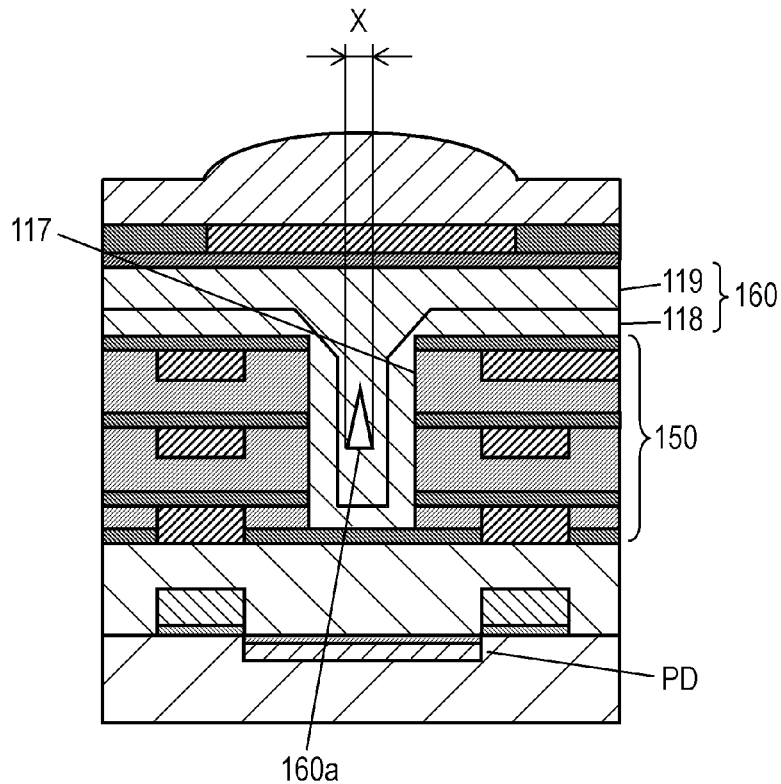
FIG. 7A is a cross-sectional view explaining relationship between an opening dimension of a concave portion and a hollow width in the solid-state imaging device according to one embodiment of the present invention.
Figure 7B:
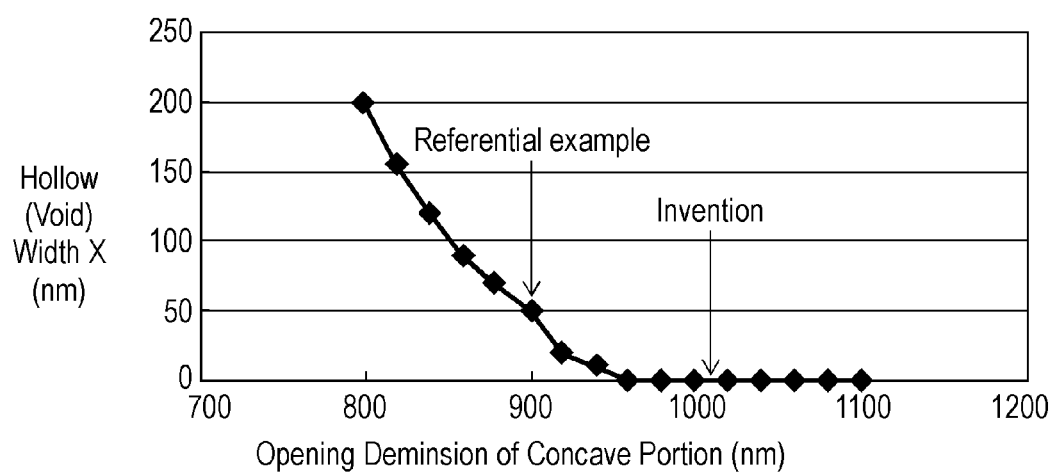
FIG. 7B is a graph explaining the relationship between the opening dimension of the concave portion and the hollow width in the solid-state imaging device according to one embodiment of the present invention.

FIGS. 7A and 7B each show the relationship between the opening dimension of the concave portion for structuring the optical waveguide and the hollow (void) width that may possibly occur inside the concave portion. In association with the cross sectional view shown in FIG. 7A, hollow (void) 160a occurring in second insulating film 160 embedded in concave portion 117 formed in first insulating film 150 and width X of concave portion 117 are shown in the graph of FIG. 7B.

In the referenatial structure, since the opening dimension of the concave portion 117 is 900 nm, even when this concave portion 117 is filled with silicon nitride, hollow 160a having a width of 50 nm occurs.

However, in the present embodiment, since the opening dimension of concave portion 117 can be increased to be 1020 nm as described above, the hollow width is 0 nm, i.e., no hollow 160a occurs. Therefore, the solid-state imaging device according to the present embodiment can achieve the optical characteristic exhibiting excellent sensitivity and the like.

As described above, according to the method for manufacturing the solid-state imaging device according to the present embodiment, concave portion 117 is formed in first insulating film 150. Thereafter, concave portion 117 is filled with second insulating film 160 being a film having high refractive index. Thereafter, the external interconnection (pad electrode 121) is formed. That is, since concave portion 117 can be formed before the external interconnection is formed, variations in the opening dimension of concave portion 117 can be reduced. Accordingly, since the opening dimension of concave portion 117 can be increased as compared to the referential example, without inviting the occurrence of hollow 160a, concave portion 117 can surely be filled with second insulating film 160 of high refractive index.

It is to be noted that, in the present embodiment, what is used as second insulating film 160 being the buried insulating film is silicon nitride (SiN) whose refractive index is approximately 1.9 to 1.95 which withstands the heat treatment temperature (heat resistant) when protection film 122 is formed by the CVD process. Further, in the present embodiment, the material of second insulating film 160 being the buried insulating film is just required to withstand the heat treatment temperature (approximately 300° C. to 400° C.) when protection film 122 is formed, and it may be silicon oxynitride (SiON) or the like. In the referential example, a resin material by the application process is used as the film with which the concave portion is filled. In this case, the refractive index is approximately as high as 1.75 at best. Therefore, using silicon nitride (SiN), silicon oxynitride (SiON) or the like whose refractive index exceeds 1.75, the sensitivity higher than the referential example can be achieved. Here, what is meant by the term heat resistant is the nature of material not greatly deteriorated by heat.

Further, first buried layer 118 and second buried layer 119 may be made of materials different from each other provided that they exhibit heat resistance when protection film 122 is formed. In this case, the materials whose refractive index exceeds 1.75 are preferable.

Further, in the present embodiment, second insulating film 160 has a two-layer structure, i.e., first buried layer 118 and second buried layer 119. That is, first buried layer 118 is formed. Subsequently, corner-cut etching for first buried layer 118 is performed to improve the filling performance of second buried layer 119. In a case where the pixels are further miniaturized and the aspect ratio of concave portion 117 is increased, it is also possible to perform the corner-cut etching twice or more, or to provide three or more buried layers.

Conversely, since the opening dimension of concave portion 117 can be increased, in the case where hollow 160a does not occur in concave portion 117 even when corner-cut etching is not performed, second insulating film 160 can be structured as a single layer. This is apparent also from the graph of FIG. 7B, based on that no hollow 160a occurs even at the point where the opening dimension of the concave portion is approximately 950 nm.

Further, in the present embodiment, though the internal interconnection is a three-layer structure and the external interconnection (pad electrode) is a single-layer structure, similar effect can be achieved when the internal interconnection and the external interconnection are each at least a single-layer structure.

Further, in the present embodiment, though first insulating film 150 having a three-layer structure is structured such that pixel portion A and peripheral circuit portion B have equivalent structures, pixel portion A and peripheral circuit portion B do not necessarily have the equivalent structure. For example, peripheral circuit portion B may be different from pixel portion A in the material and the structure.

First Variation of One Embodiment

In the following, with reference to FIGS. 8A to 9B, a description will be given of a first variation of one embodiment of the present invention.

Figure 8A:
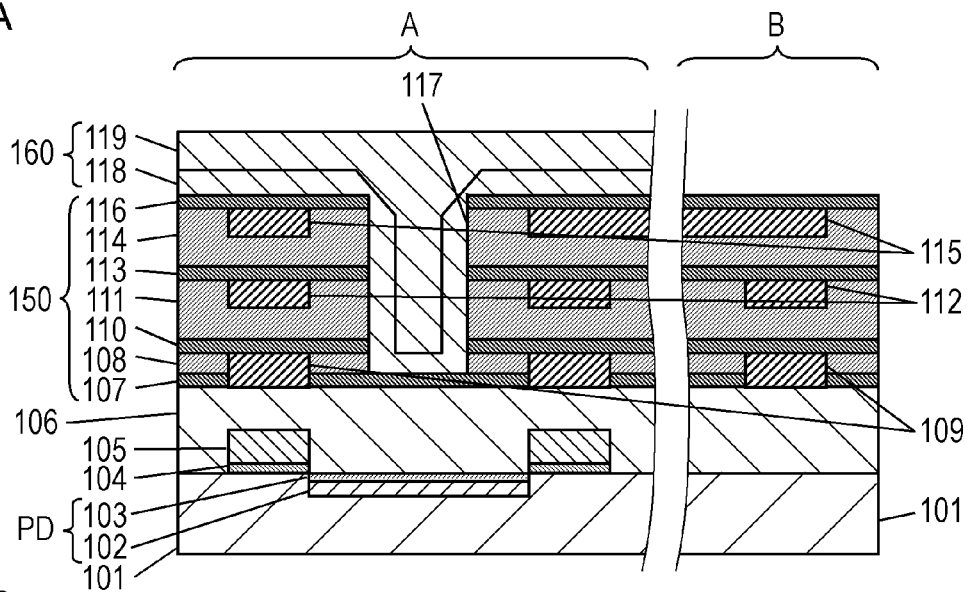
FIG. 8A is a schematic cross-sectional view showing a step of a method for manufacturing a chief portion of a solid-state imaging device according to a first variation of one embodiment of the present invention.

In the first variation, as shown in FIG. 8A, second insulating film 160 is formed, and the top face thereof is planarized. Thereafter, second insulating film 160 included in peripheral circuit portion B is selectively removed by the lithography process and the etching process.

Figure 8B:
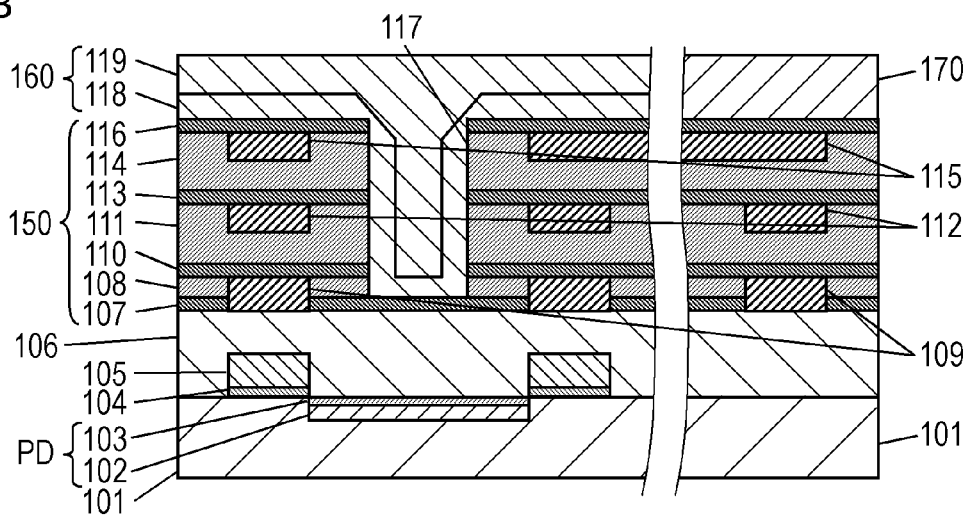
FIG. 8B is a schematic cross-sectional view showing a step of the method for manufacturing the chief portion of the solid-state imaging device according to the first variation of one embodiment of the present invention.

Next, as shown in FIG. 8B, on the entire semiconductor substrate 101, third insulating film 170 made of silicon oxide ($SiO_2$) or silicon oxynitride (SiON) is formed. Thereafter, by the lithography process and the etching process, third insulating film 170 formed in pixel portion A is selectively removed.

Figure 8C:
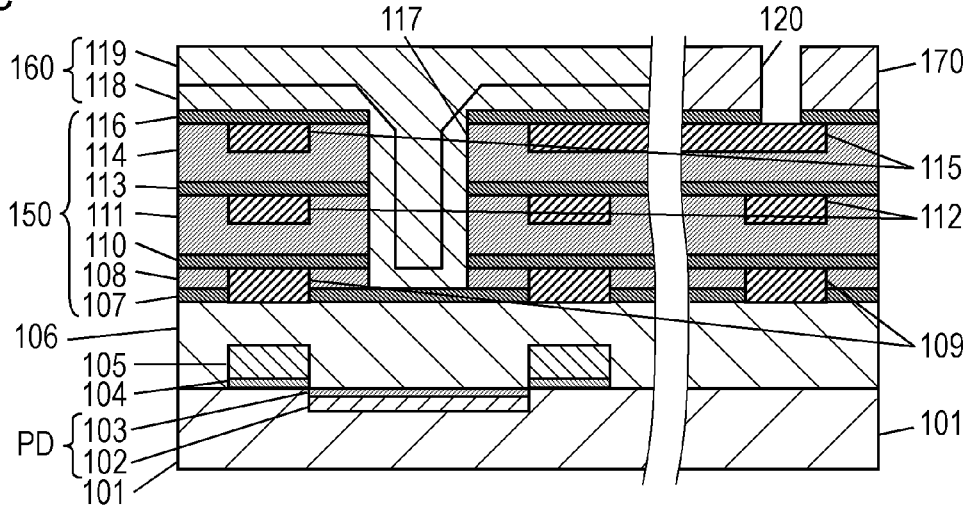
FIG. 8C is a schematic cross-sectional view showing a step of the method for manufacturing the chief portion of the solid-state imaging device according to the first variation of one embodiment of the present invention.

Next, as shown in FIG. 8C, by the lithography process and the etching process, in peripheral circuit portion B, contact hole 120 that exposes third internal interconnection 115 is selectively formed in third insulating film 170.

Figure 9A:
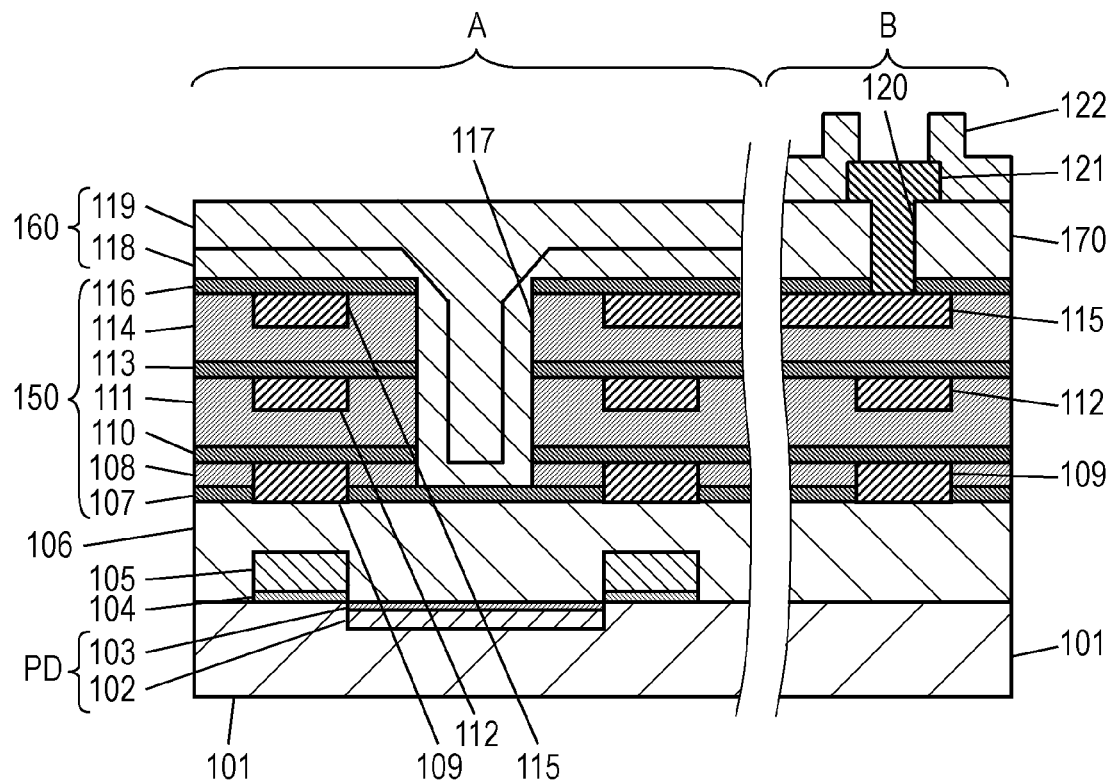
FIG. 9A is a schematic cross-sectional view showing a step of the method for manufacturing the chief portion of the solid-state imaging device according to the first variation of one embodiment of the present invention.

Next, as shown in FIG. 9A, by the lithography process, the sputtering process and the like, pad electrode 121 made of aluminum and having a thickness of, e.g., 700 nm, is selectively formed.

Subsequently, on second insulating film 160 in pixel portion A and on the entire third insulating film 170 including pad electrode 121 in peripheral circuit portion B, protection film 122 made of silicon oxide whose thickness is 300 nm is formed. Thereafter, by the lithography process and the etching process, protection film 122 formed in pixel portion A is selectively removed. Further, by the lithography process and the etching process, the portion of protection film 122 formed above the pad electrode 121 in peripheral circuit portion B is selectively removed.

Figure 9B:
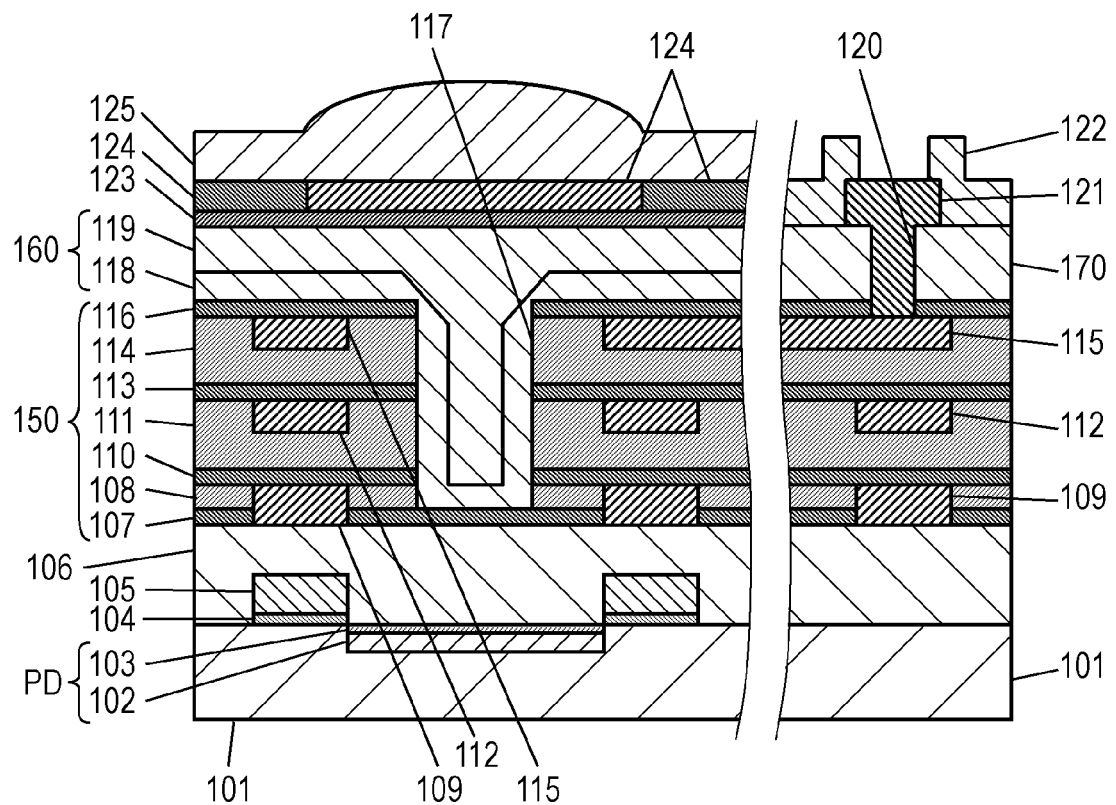
FIG. 9B is a schematic cross-sectional view showing a step of the method for manufacturing the chief portion of the solid-state imaging device according to the first variation of one embodiment of the present invention.
Figure 10:
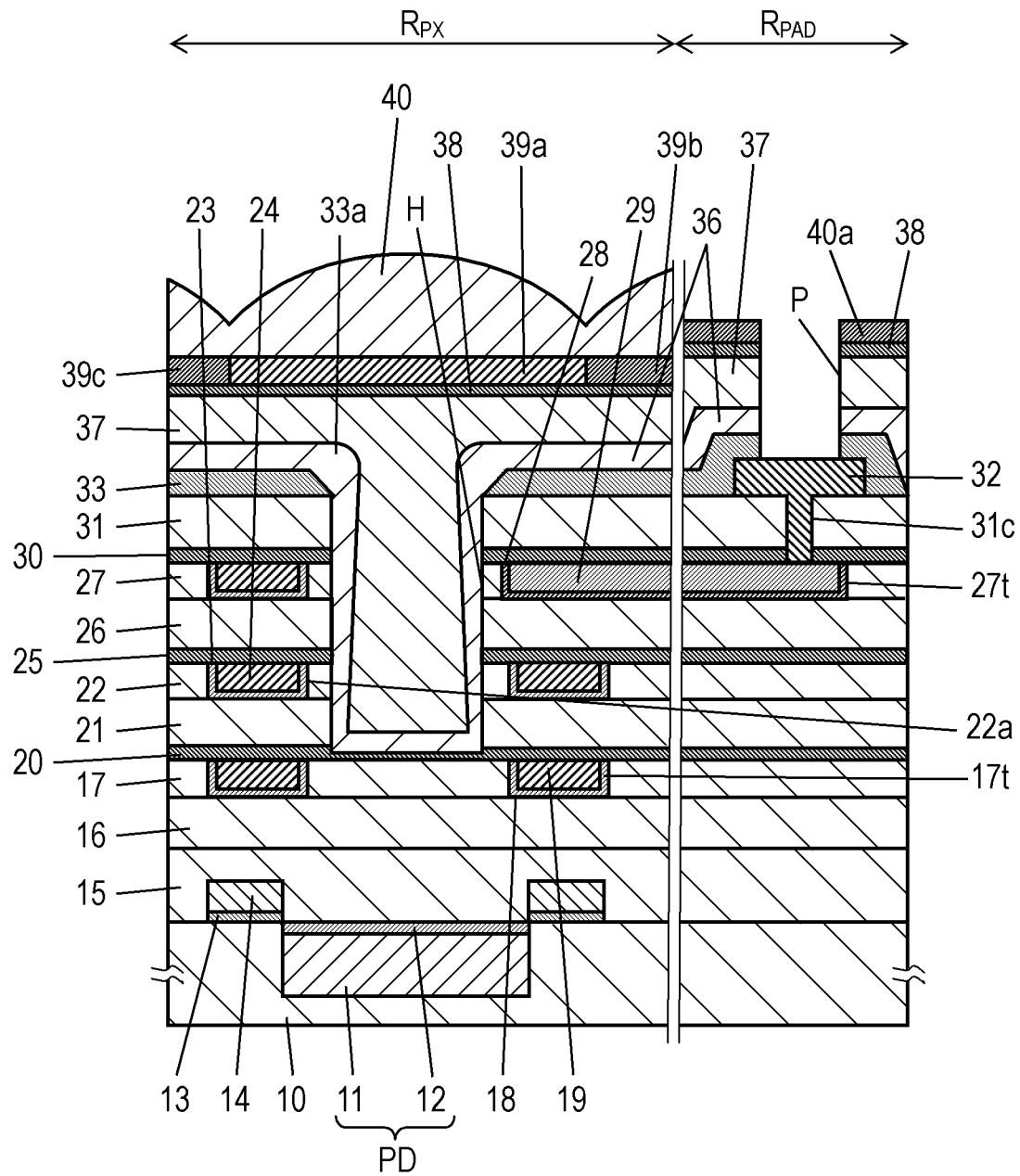
FIG. 10 is a schematic cross-sectional view of a chief portion of a solid-state imaging device according to a conventional example.

Next, as shown in FIG. 9B, on second insulating film 160 exposed in pixel portion A, planarization film 123, filter 124, and lens 125 are sequentially formed.

In the embodiment described above, second insulating film 160 embedded in concave portion 117 that structures the optical waveguide is used as it is as the interlayer insulating film between third copper interconnection 115 and pad electrode 121 in peripheral circuit portion B.

In this case, an increase in the interlayer capacitance (parasitic capacitance) between third internal interconnection 115 and pad electrode 121 may be concerned in terms of design attributed to the interlayer insulating film being made of silicon nitride and having high refractive index.

Accordingly, in the present variation, second insulating film 160 being the interlayer insulating film between third internal interconnection 115 and pad electrode 121 in peripheral circuit portion B is replaced by third insulating film 170 made of silicon oxide or silicon oxynitride whose refractive index is lower than that of second insulating film 160.

With such a structure also, since concave portion 117 is formed before pad electrode 121 is formed, it is apparent that the effect similar to that according to one embodiment of the present invention can be achieved.

The solid-state imaging device and the method for manufacturing the same of the present invention enables an increase in the opening dimension of the optical waveguide provided above the photodiode. Therefore, the present invention allows the optical waveguide to be surely filled with the films having high refractive index without inviting occurrence of a hollow. Accordingly, the present invention is useful for a solid-state imaging device including an optical waveguide or the like.

What is claimed is:

1. A solid-state imaging device that is formed on a semiconductor substrate and that includes a pixel portion and a peripheral circuit portion, wherein
the pixel portion includes:
a photodiode that is formed on the semiconductor substrate;
a first insulating film that is formed on the semiconductor substrate and that includes a concave portion above the photodiode; and
an optical waveguide that is formed in the concave portion and that guides light to the photodiode, wherein the optical waveguide is structured with a second insulating film with which the concave portion is filled, and a portion of the second insulating film positioned on an outer side of the concave portion in the pixel portion is formed on the first insulating film and contacts the top face of the first insulating film,
the peripheral circuit portion includes:
an interconnection that is formed in one of the first insulating film and an interlayer insulating film being an identical-level layer as the first insulating film;
a pad portion that is formed on the interconnection and that is electrically connected to the interconnection; and
a third insulating film that is formed on the first insulating film in the peripheral circuit portion, wherein the pad portion is formed on the third insulating film.

2. The solid-state imaging device according to claim 1, wherein
the second insulating film and the third insulating film are a continuous film made of an identical material.

3. The solid-state imaging device according to claim 1, wherein
the second insulating film and the third insulating film are made of different materials, and
the third insulating film is a film made of a material lower than the second insulating film in a refractive index.

4. The solid-state imaging device according to claim 1, wherein
the third insulating film has a refractive index smaller than 1.75.

5. The solid-state imaging device according to claim 1, wherein
the second insulating film has a refractive index greater than 1.75.

6. The solid-state imaging device according to claim 1, wherein
the second insulating film includes one of silicon nitride and silicon oxynitride.

7. The solid-state imaging device according to claim 1, wherein
the second insulating film is structured with a film made up of at least two layers.

8. The solid-state imaging device according to claim 7, wherein
a peripheral portion at a top end of the concave portion of at least a first one of the two layers of the second insulating film is formed so as to widen upward.

9. The solid-state imaging device according to claim 1, wherein
a height of a top face of the second insulating film in the pixel portion and a height of a top face of the third insulating film in the peripheral circuit portion are identical to each other.

10. The solid-state imaging device according to claim 1, wherein
the interconnection includes copper as its main component, and the pad portion includes aluminum as its main component.

* * * * *